United States Patent
Elam et al.

(10) Patent No.: US 8,318,248 B2
(45) Date of Patent: Nov. 27, 2012

(54) SPATIALLY CONTROLLED ATOMIC LAYER DEPOSITION IN POROUS MATERIALS

(75) Inventors: Jeffrey W. Elam, Elmhurst, IL (US); Joseph A. Libera, Clarendon Hills, IL (US); Michael J. Pellin, Naperville, IL (US); Peter C. Stair, Northbrook, IL (US)

(73) Assignee: Uchicago Argonne, LLC, Chicago, IL (US)

( * ) Notice: Subject to any disclaimer, the term of this patent is extended or adjusted under 35 U.S.C. 154(b) by 426 days.

(21) Appl. No.: 12/478,578

(22) Filed: Jun. 4, 2009

(65) Prior Publication Data

US 2009/0304920 A1 Dec. 10, 2009

Related U.S. Application Data

(60) Provisional application No. 61/060,025, filed on Jun. 9, 2008.

(51) Int. Cl.
*C23C 16/00* (2006.01)
(52) U.S. Cl. .................................. 427/248.1
(58) Field of Classification Search ............... 427/248.1
See application file for complete search history.

(56) References Cited

U.S. PATENT DOCUMENTS

2005/0223968 A1* 10/2005 Randall et al. ................. 117/94
* cited by examiner

*Primary Examiner* — Kelly M Gambetta
(74) *Attorney, Agent, or Firm* — Foley & Lardner LLP (57) ABSTRACT

Methods for the selective deposition of materials within a porous substrate. The methods use the passivating effects of masking precursors applied to the porous substrate. A portion of a pore surface within the substrate is masked by exposing the substrate to one or more masking precursors. The depth of the pore surface that is masked is controllable by regulating the exposure of the substrate to the masking precursor. Application of the masking precursor prevents adsorption of one or more subsequently applied metal precursors about a portion of the pore surface coated by the masking precursor. Less than an entirety of the unmasked pore surface is coated by the metal precursor, forming a metal stripe on a portion of the pore surface. The depth of the metal stripe is controllable by regulating exposure of the porous substrate to the metal precursor. Subsequent exposure of the substrate to a saturating water application oxidizes the deposited precursors.

14 Claims, 11 Drawing Sheets

SEM Image
FIG. 13A

Al x-ray Intensity
FIG. 13B

Zn x-ray Intensity
FIG. 13C

FIG. 14

SPATIALLY CONTROLLED ATOMIC LAYER DEPOSITION IN POROUS MATERIALS

CROSS REFERENCE TO RELATED PATENT APPLICATIONS

The present application claims priority to U.S. Provisional Patent Application No. 61/060,025, filed Jun. 9, 2008 incorporated herein by reference in its entirety.

STATEMENT OF GOVERNMENT INTEREST

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

FIELD OF THE INVENTION

This invention is directed toward methods for depositing materials within porous substrates employing atomic layer deposition ("ALD") techniques. More particularly, the invention is directed toward methods of ALD for depositing uniform films at controlled depths and widths within the pores of various porous substrates through application of passivating precursors.

BACKGROUND OF THE INVENTION

ALD is a thin film growth method using alternating, self limiting reactions between gaseous precursors and a solid surface to deposit materials in an atomic layer-by-layer fashion. These attributes allow highly conformal and uniform films to be deposited on complex, three-dimensional substrates such as aerogels, powders, and anodic aluminum oxide ("AAO") membranes useful in numerous applications. For instance, functionalization of a porous substrate by ALD allows for the synthesis of useful catalytic materials. It would be advantageous to construct catalytic structures with localized regions of different catalytic materials in a specific sequence along the internal walls of the nanopores of a substrate. Such structures could afford precise control over a multi-step catalytic process because the reacting feed stream would encounter the different catalytic sites in a predetermined order. It also might be useful in creating internal wiring structures for solar to fuels devices.

Heretofore, conventional ALD on porous substrates resulted in uniform infiltration of the deposited material into the entirety of the porous substrate, forming a uniform coating on all of the interior surfaces. Although a variety of techniques have been developed to allow patterning of ALD films using masking or passivating agents, these techniques are limited to planar substrates. For example, self assembled monolayers of long-chained, hydrophobic alkanes such as docosyltrichlorosilane ("DTS") have been used as a masking agent for selective ALD of zinc oxide. However, such techniques are limited to depositing a mask pattern on a flat surface.

Thus, there is a need for methods capable of precisely applying various materials at localized regions within nano-porous materials. It is desirable to overcome limitations, such as those described above, to facilitate fabrication of structures having one or more coatings within nano-porous materials.

SUMMARY OF THE INVENTION

The methods of the present invention permit selective deposition of materials using ALD techniques at controlled depths on complex geometries within a porous substrate. The methods rely on the passivating effects of one or more masking precursors applied to the porous substrate. A portion of a pore surface within the substrate can be masked by exposing the substrate to one or more masking precursors. By regulating exposure of the substrate to the masking precursor, the depth of the pore surface that becomes masked is controllable. Application of the masking precursor prevents adsorption of one or more subsequently applied metal precursors along the portion of the pore surface coated by the masking precursor. The metal precursor reacts with and coats an unmasked portion of the pore surface. By regulating exposure of the porous substrate to the metal precursor, less than an entirety of the unmasked pore surface is coated by the metal; and a metal stripe is deposited on a portion of the pore surface. The depth of the metal stripe is controllable by regulating exposure of the substrate to the metal precursor. The depth of the masking precursors, thereby the position of the metal precursor, and the depth of the metal precursor are attributable to Knudsen diffusion effects, wherein diffusion through nanopores is related to the exposure time of the nanopores to the reactants, the partial pressure of the reactants, the mass of the reactants, and the temperature. Subsequent exposure of the substrate to a saturating application of water vapor or other oxygen-containing precursor vapor removes the ligands from the deposited metal precursors and prepares the growing film for subsequent deposition.

In one embodiment, the method is used to deposit one or more stripes of metal oxide on the pore surfaces of an AAO membrane. The AAO membrane pores can be coated with stripes of various metal oxides, such as, but not limited to, $ZnO$, $TiO_2$, $MgO$, $V_2O_5$ and $Nb_2O_5$. The location and depth of the metal oxide stripes within the pores is controlled by regulating the ALD timing sequence, thereby masking one or more portions of the pore surface by first exposing the AAO membrane to a masking precursor such as trimethyl aluminum (TMA). Multiple distinct metal oxide stripes are formed on portions of the pore surface by further controlling exposure of the masking precursor and the metal precursor sequences.

In addition to forming stripes of metal oxides in porous materials, this method can also be used to deposit stripes of metals, metal nitrides, metal sulfides, metal phosphides, metal carbides, and other ALD materials.

In another embodiment, the method is used to deposit a stripe of metal oxide within a nano-porous particle, such as, but not limited to, a silica gel. The location and depth of the metal oxide stripe, such as a ZnO stripe, is formed in the nano-porous particle by regulating the ALD timing sequence.

The present invention is useful in a number of commercial applications. For example, the methods may be employed to synthesize nano-porous catalytic membranes that permit control over sequential catalytic processes or the spatial location of the catalysts. As another example, the methods may be employed to synthesize catalysts from nano-porous particles in which the active catalyst is applied as a stripe or concentric shell below the level of the surface. In this way, the active catalyst which might be a precious metal, such as platinum, is protected from mechanical attrition. The methods are also useful, but not limited to, the fabrication of catalysts, sensors, separations membranes, electron multipliers, solar cells, and nuclear fuel assemblies.

These and other objects, advantages and features of the invention, together with the organization and manner of operation thereof, will become apparent from the following detailed description when taken in conjunction with the accompanying drawings.

BRIEF DESCRIPTION OF THE DRAWINGS

FIG. 12B shows an EDAX elemental map for Zn of the spherical silica gel particle in FIG. 12A.

DETAILED DESCRIPTION OF PREFERRED EMBODIMENTS

Figure 1:
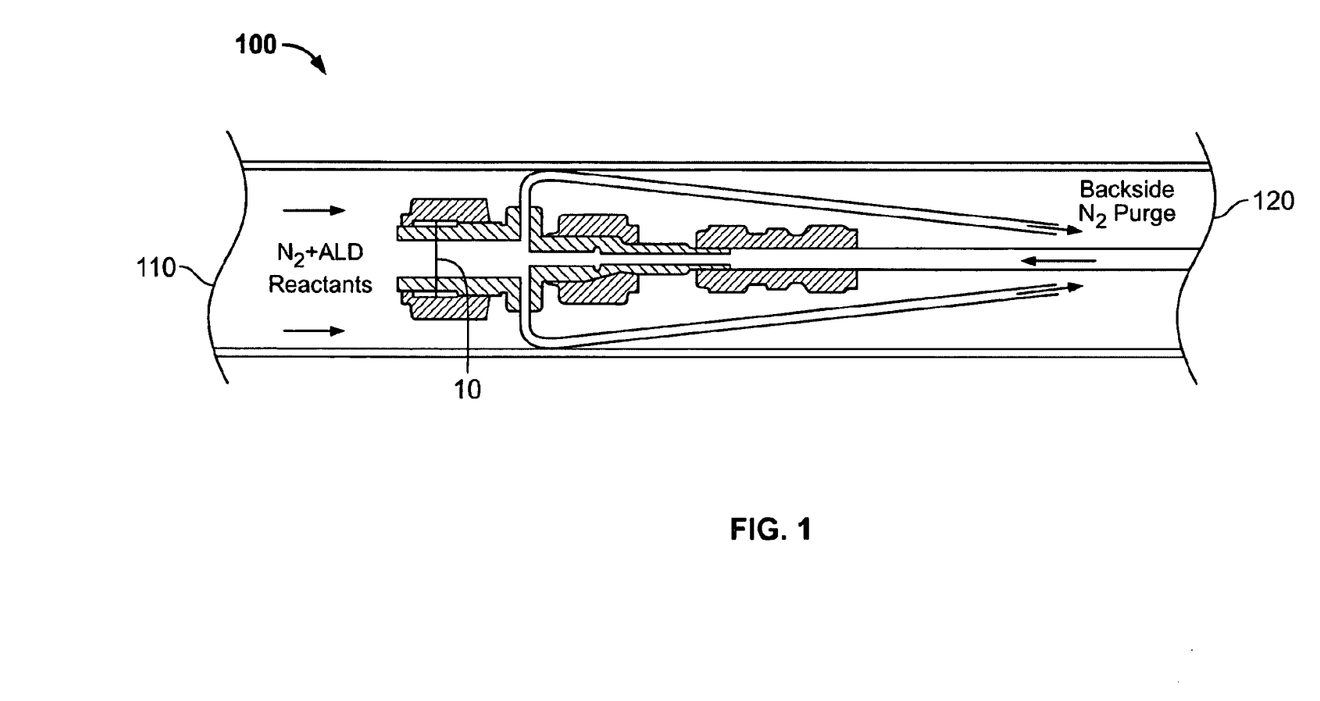
FIG. 1 illustrates a viscous flow reactor with a mounted AAO membrane configured to provide backside $N_2$ purge.

The present invention relates to methods of preparing patterned growth of one or more ALD materials in porous substrates and the resulting structures. In one embodiment, an ALD film is deposited on a supported AAO membrane 10 positioned in a viscous flow reactor 100 having a first end 110 and a second end 120, as depicted in FIG. 1. Ultrahigh purity nitrogen carrier gas and ALD reactants enter the viscous flow reactor 100 from the first end 110. In one embodiment, the nitrogen carrier gas is applied with a mass flow rate of about 360 sccm and a pressure of about 1 Torr. Nitrogen purge gas enters the viscous flow reactor 100 from the second end 120 as depicted in FIG. 1.

Figure 2A:
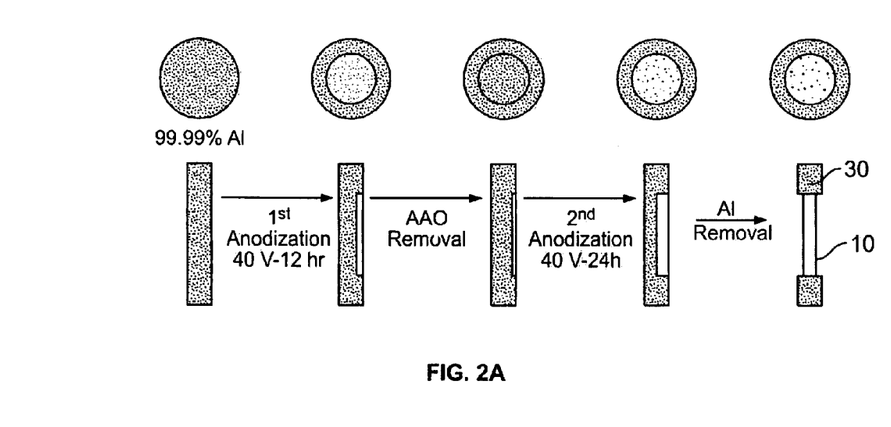
FIG. 2A illustrates the anodization process for fabricating the AAO membrane of FIG. 1.
Figure 2B:
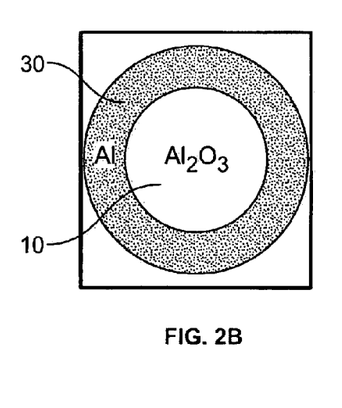
FIG. 2B illustrates the AAO membrane and integral sealing ring formed by the process depicted in FIG. 2A.
Figure 2C:
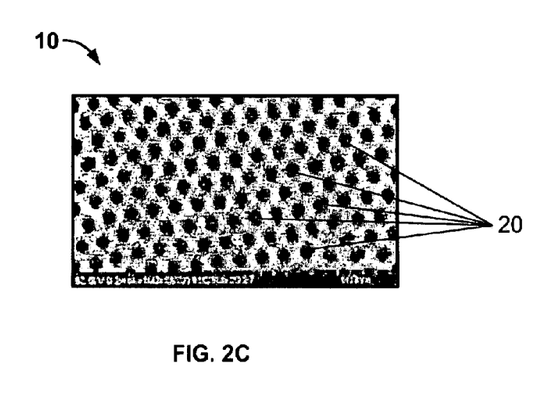
FIG. 2C shows a plan view SEM image of the AAO membrane formed by the process depicted in FIG. 2A and indicating the hexogonally-arranged nanopores.
Figure 2D:
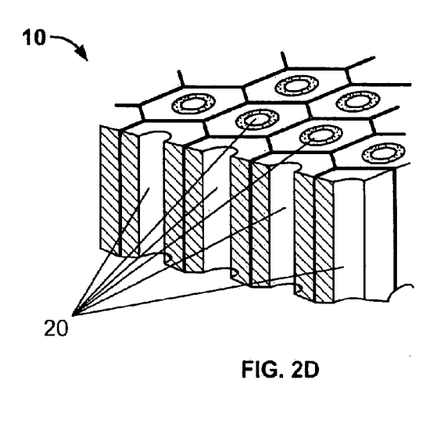
FIG. 2D shows a perspective view of a schematic depicting the hexogonally-arranged nanopores of FIG. 2C.

The supported AAO membrane 10 is prepared from high purity aluminum metal disks using conventional methods of electrochemical anodization. One method of preparing the AAO membrane 10 is described in detail in Example 1 below. In general, an anodization procedure yields an AAO membrane having well-ordered pore arrays comprising a plurality of nanopores 20 orientated substantially normal to the major plane of the AAO membrane 10, as shown in FIG. 2C and further depicted in FIG. 2D. As shown in FIG. 2B, the anodization procedure can be performed such that a free-standing AAO membrane 10 can be formed within the annulus of an integral aluminum sealing ring 30. In this way, a gas-tight seal to the AAO membrane 10 in the viscous flow reactor 100 can be achieved by using commercially available face-seal fittings.

One or more films can be deposited within the plurality of the nanopores 20 by ALD. For example, a zinc oxide film can be applied by exposing a hydroxylated surface of the AAO membrane 10 to diethyl zinc ("DEZ"), which reacts with and coats the walls of the plurality of the nanopores 20. Subsequently presenting the AAO membrane 10 with a saturating water exposure forms a zinc oxide coating within the nanopores 20. Similarly, the deposition coating process can be carried out for other metals, such as, but not limited to, titanium, magnesium, vanadium, and niobium, with their respective oxides formed upon a saturating application of water vapor or exposure to other oxygen-containing vapor. In addition to forming stripes of metal oxides in porous materials, this method can also be used to deposit stripes of metals, metal nitrides, metal sulfides, metal phosphides, metal carbides, and other ALD materials.

In one embodiment, the position and depth of the metal oxide coating within the plurality of the nanopores 20 can be controlled through exposure of the AAO membrane 10 to a precursor. Application of the precursor causes the nanopore surface to be unreactive towards the chemisorption of the subsequently applied metal. For example, prior exposure of the AAO membrane 10 to trimethyl aluminum ("TMA") prevents the usual reaction of DEZ with the nanopore surface. This effect can be combined with the fact known in the art that the infiltration of a nano-porous material under normal ALD conditions occurs via Knudsen diffusion in which the reactive sites in the nanopores 20 tend to react in order starting from the entrance of the pore.

Figure 3A:
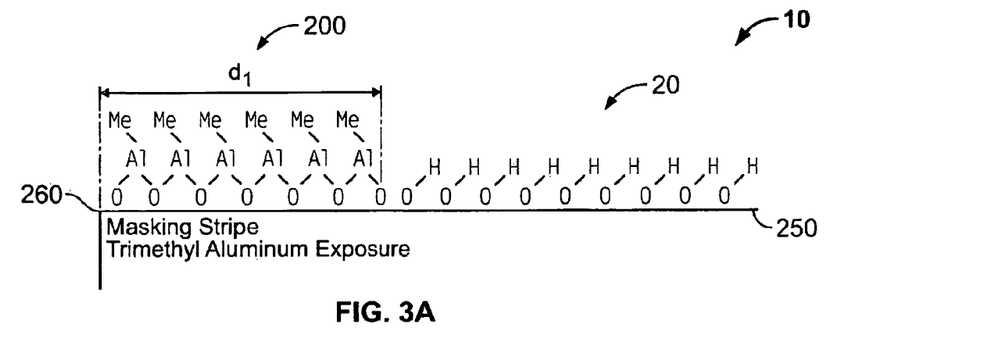
FIG. 3A shows a cross-sectional schematic depicting a representative nanopore of FIG. 2C following a TMA exposure and forming a masking stripe of depth d1 on a portion of the nanopore surface.
Figure 3B:
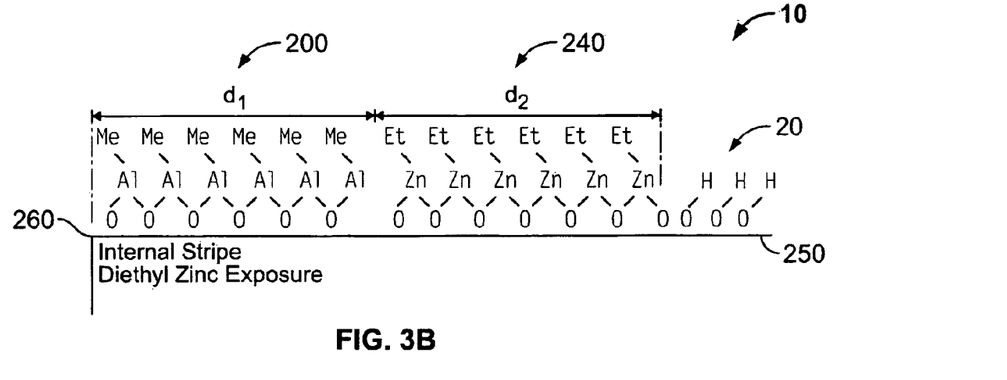
FIG. 3B is a cross-sectional schematic depicting the nanopore of FIG. 3A following a DEZ exposure and forming a metal stripe of depth d2 on a portion of the nanopore surface.
Figure 3C:
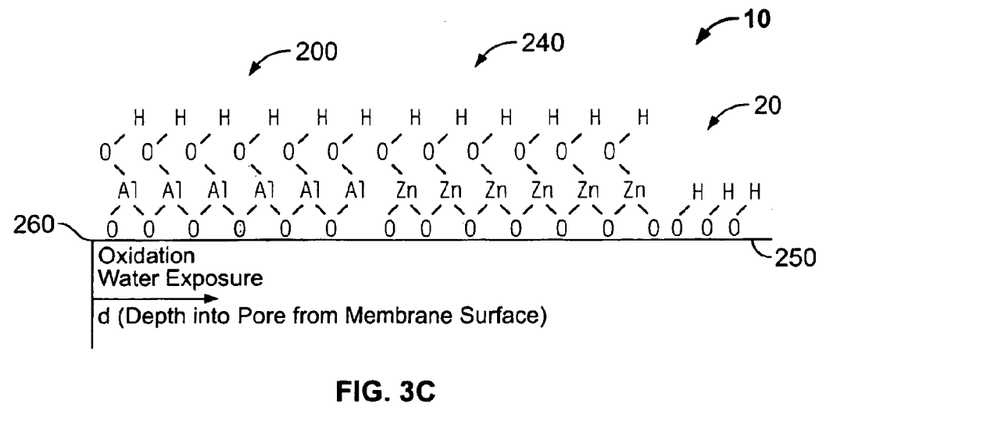
FIG. 3C is a cross-sectional schematic depicting the nanopore of FIG. 3B following a $H_2O$ exposure and forming metal oxides on a portion of the nanopore surface.

As illustrated in FIG. 3A, by limiting the exposure time of the membrane 10 to the precursor, e.g. TMA, a masking stripe 200 forms on a portion of a pore wall 250 of the nanopores 20. As a consequence of the Knudsen diffusion effect, the masking stripe 200 begins at a pore entrance 260 and proceeds to a depth $d_1$ along the pore wall 250. Subsequent exposure of the AAO membrane 10 with the second precursor, e.g. DEZ, coats a portion of the pore wall, commencing at depth $d_1$. The masking stripe 200 makes a portion of the pore wall 250 unreactive to the second precursor from the surface of the AAO membrane 10 and extending to depth $d_1$. As illustrated in FIG. 3B, a stripe 240 of chemisorbed DEZ precursor commencing at or about depth $d_1$ and extending to depth $d_2$ is formed on a portion of the pore wall 250 by limiting the exposure time of the second precursor. Finally, exposure of the AAO membrane 10 to water forms the corresponding metal oxides on the pore wall 250, as depicted in FIG. 3C. As shown in FIG. 2, installing the AAO membrane 10 in the depicted manner ensures that the ALD precursors only contact the membrane 10 from one side. This mounting method causes the ALD stripes to form from only one side of the membrane 10.

Figure 4:
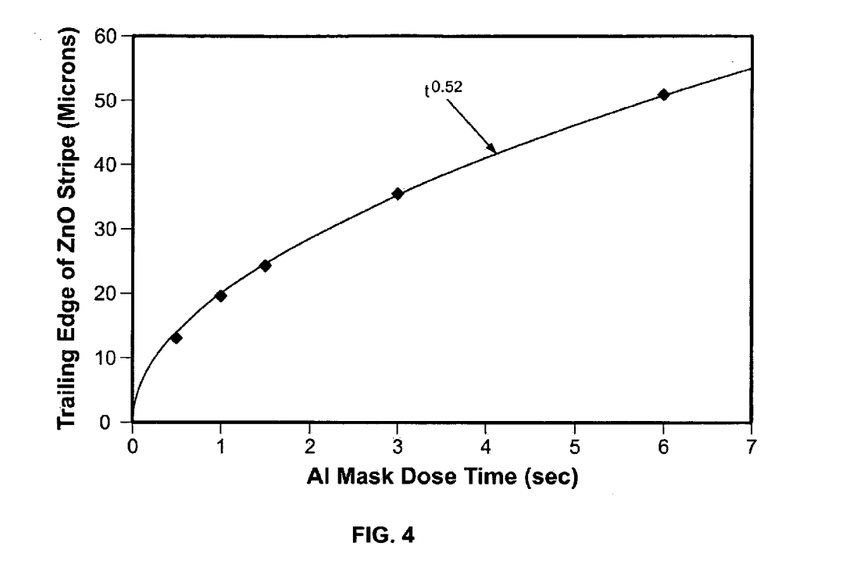
FIG. 4 shows a plot showing the trailing edge location of a ZnO stripe formed in AAO with respect to masking precursor dose time (exposure time)

The ALD timing sequences of the coating process can be expressed as $t_1$-$t_2$-$t_3$-$t_4$-$t_5$-$t_6$ where $t_1$ is the exposure time for the first precursor, $t_2$ is the purge time following the first exposure, $t_3$ is the exposure time for the second precursor, $t_4$ is the purge time following the exposure to the second precursor, $t_5$ is the exposure time to the coreactant precursor (e.g. water vapor), and $t_6$ is the purge time following the coreactant precursor. By varying the precursor exposure times, the depths $d_1$ and $d_2$ are highly controllable. Thus, controlling the exposure time, $t_1$, of a first masking precursor, the depth $d_1$, or starting location of the stripe 240, can be controlled. Likewise, controlling the time, $t_3$, of a second metal precursor, the depth $d_2$, or the width of the stripe 240, can be predictably controlled. For example, FIG. 4 illustrates the relationship between the masking precursor exposure time and the depth of the metal oxide stripe 240. The process can be extended to add subsequent stripes of metals at desired positions along the surface of the pore wall 250.

Figure 14:
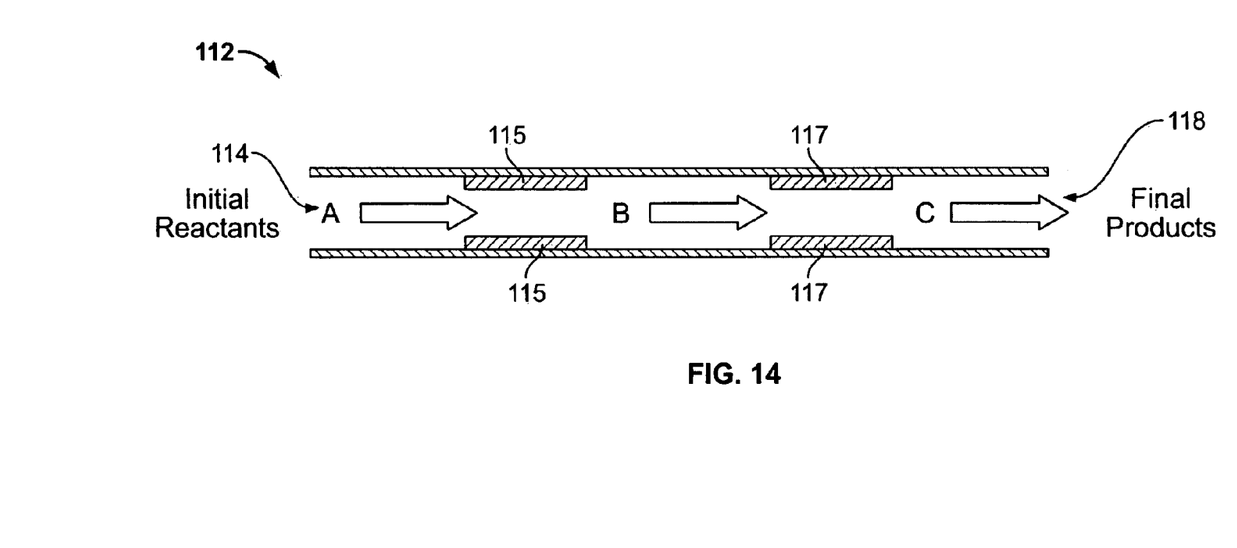
FIG. 14 illustrates a cross-sectional schematic view of a representative nanopore as a medium for a sequential catalytic reaction capable of executing the process of the present invention.

Application of this process can advantageously form multi-stripe, multi-material catalysts that precisely control reactions. For example, an AAO membrane may be constructed with multi-striped pores to efficiently react with a feed stream in a predetermined order, as depicted in FIG. 14. For instance, initial reactants A enter an ALD nanopore 112 at a first end 114 and encounter a first ALD stripe catalyst 115 within the nanopore, thereby converting reactant A to product B. Product B continues to travel through the nanopore 112, eventually encountering a second ALD stripe catalyst 117 within the nanopore 112, thereby converting product B to final product C. The final product C then exits the nanopore 112 at a second end 118. One skilled in the art will appreciate that alternative arrangements can be constructed, including additional stripe catalysts in the nanopore 112. Other applications include, but are not limited to sensors, separation devices, and three-dimensional nuclear fuel structures having enhanced heat transfer properties, and electron multipliers having regions of high- and low-secondary electron emission (SEE) materials arranged along the pore walls.

The ALD stripe coating methods can be generalized to use with other metal oxides. For example, in addition to the formation of $ZnO$, $TiO_2$, and $MgO$ stripes within nano-porous materials, samples have also been prepared with stripes of $V_2O_5$ and $Nb_2O_5$ using a similar approach. Additionally, the methods are not limited to ALD stripe coatings in AAO materials. For example, the formation of $Al_2O_3$ stripes in nano-porous silica gel powder is described in detail below. Further, one skilled in the art will appreciated that the processes can be generalized to other powders, aerogels, and other nanoporous support structures using various materials deposited by ALD.

Various aspects of the present invention will now be further explained in the following illustrative examples. However, the present invention should not be construed as limited thereby. One of ordinary skill in the art will understand how to vary the exemplified methods to obtain the desired results.

EXAMPLE 1

Preparation of AAO Membrane Samples

The AAO membranes 10 were prepared by the electrochemical anodization of high purity aluminum metal disks. The disks had a thickness of 0.6 mm and a diameter of 19 mm. A two-step anodization procedure was performed in 0.3 M oxalic acid at 40 V to obtain well-ordered pore arrays in the disks. Boundary layer removal was accomplished using phosphoric acid. As illustrated in FIG. 2A, a masking process employed during the anodization and boundary layer removal steps allowed a free-standing AAO membrane to be fabricated, attached about its perimeter to the starting thickness of aluminum. A gas-tight seal in the viscous flow reactor 100 was applied to the resulting samples using commercial VCR® face-seal fittings. The resulting AAO membranes 10, depicted in FIG. 2B, were 10 mm in diameter and had a thickness of about 70 µm to 75 µm. Analysis of the AAO membranes 10, using scanning electron microscopy ("SEM"), revealed an average pore diameter of 56 nm and the pore size distribution had a full width at half-maximum of 3.8 nm. FIG. 2C is a SEM image showing the hexagonally arranged nanopores 20 distributed on the AAO membrane 10. The pore density of the AAO membrane 10 was determined to be 154 pores µm².

After various ALD coating processes, as described in detail below, the AAO membranes 10 were cleaved; and the fragments were embedded in silver epoxy, polished flat, and then carbon-coated using an evaporative coater. Elemental maps were acquired using a SEM with a field emission gun electron beam source and energy dispersive analysis of X-ray ("EDAX") detector. Elemental area maps were stored as bitmaps, and the resulting bitmaps were integrated along the lateral dimension parallel to the AAO membrane pores to produce depth-integrated elemental distribution profiles.

EXAMPLE 2

Monte Carlo Simulation

Monte Carlo simulations were performed to evaluate the EDAX measurements obtained from the AAO membranes. These simulations modeled the AAO pores as a one-dimensional array, and simulated the ALD stripe-coating experiments by following the trajectories of individual TMA and DEZ molecules diffusing along the nanopores. Knudsen diffusion was assumed because the mean free path of the DEZ molecules in 1 Torr $N_2$, about 50 μm, is much greater than the AAO pore diameter, about 50 nm. Consequently, the diffusion was simulated as a one-dimensional random walk of hop-length D, the local pore diameter. After each hop, if the molecule encountered an empty site, the molecule would react with probability equal to the reactive sticking coefficient, $10^{-3}$. Each trajectory continued until the molecule reacted or left the tube, and the number of trajectories was selected to model the experimental exposure times and the pressures of DEZ and TMA, respectively. The $H_2O$ exposures used in the experiments always exceeded the corresponding DEZ and TMA exposures and were saturating, so it was not necessary to include the $H_2O$ exposures in the simulations. Each ALD cycle corresponded to a TMA and DEZ exposure, and if reaction occurred at any site along the nanopore during the cycle, the local pore diameter, D, was reduced to account for the film deposition at that location.

EXAMPLE 3

Formation of ZnO Surface Stripes in AAO

Figure 5A:
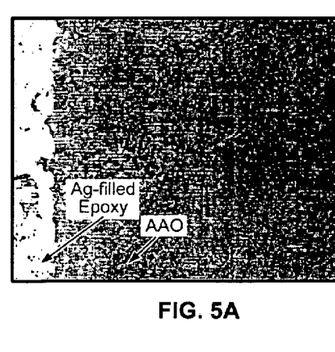
FIG. 5A shows an SEM secondary electron image of the cross section of an AAO membrane nanopore coated with a ZnO surface stripe.
Figure 5B:
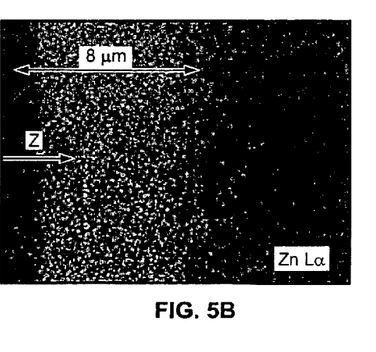
FIG. 5B shows an EDAX elemental map for Zn of the image of FIG. 5A illustrating the position of the ZnO stripe within the nanopore.
Figure 5C:
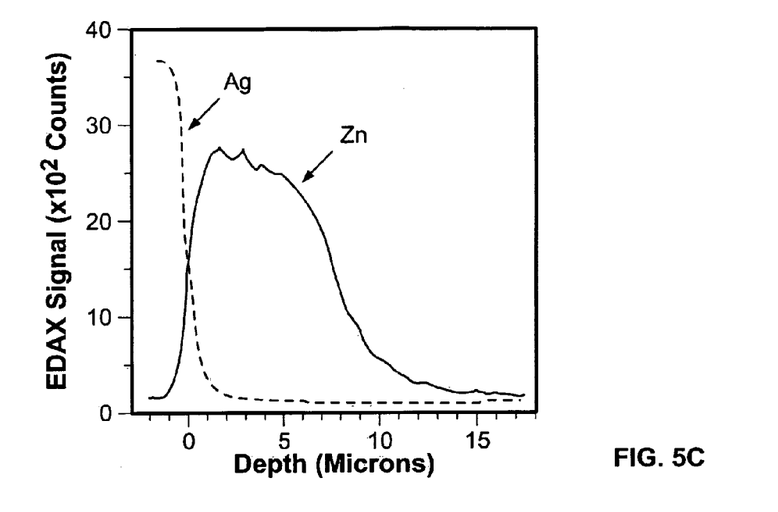
FIG. 5C shows a linescan of the data of FIG. 5B indicating the position of the ZnO stripe with respect to the edge of the AAO membrane as delineated by the silver (Ag) EDAX signal originating from the silver epoxy applied to the edges of the membrane prior to analysis.

A stripe of ZnO was formed at the surface edge of the AAO membrane 10 by applying 60 cycles of DEZ/$H_2O$ with the timing sequence 1-10-1-10. The results achieved by this process are illustrated in FIGS. 5A, 5B and 5C. The DEZ and $H_2O$ exposure times were chosen to be sub-saturating so that the precursors would not completely infiltrate the nanopores. Following the deposition, the AAO membrane 10 was cleaved, and a cross-sectional specimen was analyzed by SEM and EDAX. FIG. 5A shows a SEM secondary electron image of the sample. The location of the back side of the membrane is indicated by the interface between the silver epoxy and the AAO membrane 10. FIG. 5B shows an EDAX map of the distribution of Zn in the sample as monitored by the Zn Lα line. The z-axis in FIG. 5B is aligned substantially parallel to the AAO pores. The Zn penetrates approximately 8 microns into the AAO membrane 10 as shown in FIG. 5B.

FIG. 5C shows a linescan of the image data presented in FIG. 5B. The solid line indicates the Zn Lα linescan resulting from averaging the data in FIG. 5B along the dimension substantially normal to the z-axis. The dashed line in FIG. 5C results from averaging the EDAX image for the Ag Lα (not shown). FIG. 5C indicates the boundary between the Ag and Zn regions is sharp and has a width of about 2 microns, which is limited by the EDAX probe size. The Zn stripe extends about 8 microns into the AAO membrane 10 and the trailing edge of the stripe is broader than the Ag and Zn boundary.

EXAMPLE 4

Formation of ZnO Internal Stripes in AAO

Internal stripes of ZnO were formed in the AAO membrane 10 at various depths and widths by using TMA as a masking agent to prevent the adsorption of DEZ at the entrance of the nanopores 20. A series of trials were conducted varying the duration of TMA exposure, while maintaining other parameters constant. TMA exposure times of 0.5, 1.0 and 1.5 seconds and a TMA purge time of 5.0 seconds were used. Internal ZnO stripes were formed by applying 20 ALD cycles of TMA/DEZ/$H_2O$ at a deposition temperature of 150° C. A 4-10-5-15 DEZ and $H_2O$ timing sequence was applied. The results achieved by these processes are illustrated in FIGS. 6A, 6B, 6C, and 7A.

Figure 6A:
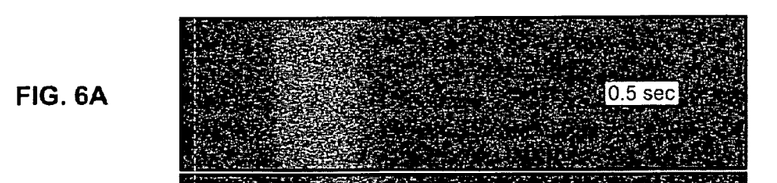
FIG. 6A shows an EDAX elemental map for Zn indicating the position of the ZnO stripe within the nanopores of an AAO membrane with a TMA masking stripe exposure time of 0.5 seconds.
Figure 6B:
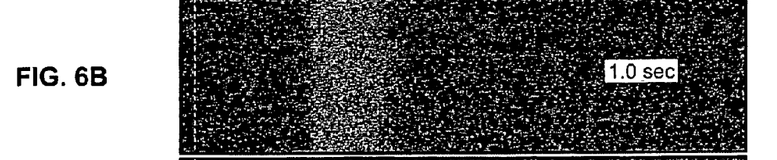
FIG. 6B shows an EDAX elemental map for Zn indicating the position of the ZnO stripe within the nanopores of an AAO membrane with a TMA masking stripe exposure time of 1.0 second.
Figure 6C:
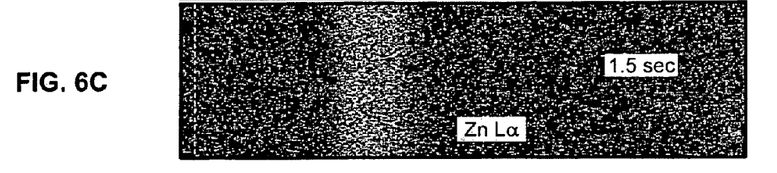
FIG. 6C shows an EDAX elemental map for Zn indicating the position of the ZnO stripe within the nanopores of an AAO membrane with a TMA masking stripe exposure time of 1.5 seconds.

FIGS. 6A, 6B, and 6C show EDAX elemental maps for Zn in the AAO membranes 10 in response to increasing TMA exposure times of 0.5, 1.0, and 1.5 seconds, respectively. The dashed line indicates the back side of the AAO membrane 10 as determined by the boundary between the Al and Ag EDAX maps (not shown). As shown in FIGS. 6A, 6B, and 6C, both the depth of the leading edge and the depth of the trailing edge of the ZnO stripe increase in response to increasing TMA exposure time. The width of the ZnO stripe also narrows with increasing TMA exposure time.

Figure 7A:
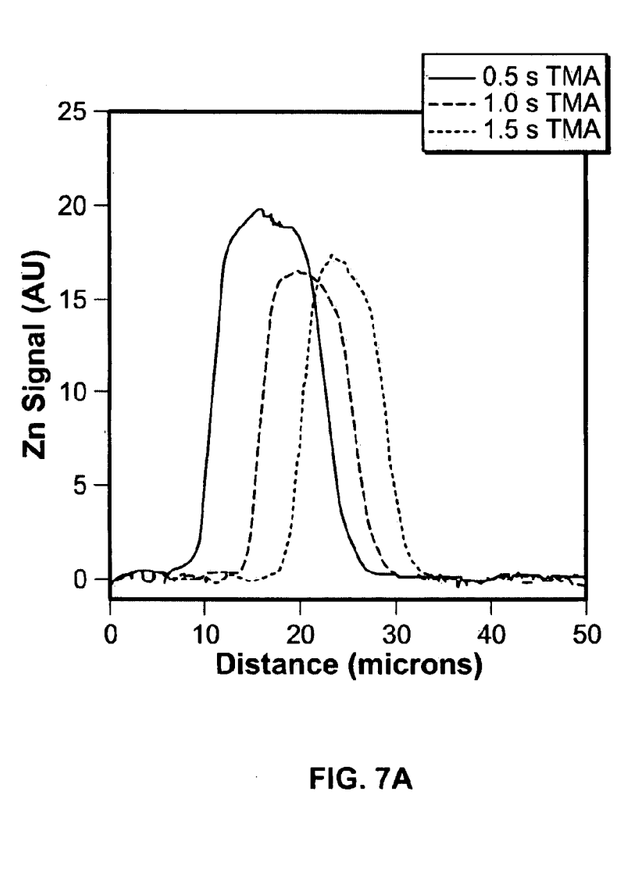
FIG. 7A shows a linescan of the data of FIGS. 6A, 6B, and 6C indicating the position of the Zn stripe with respect to the edge of the AAO membrane.
Figure 7B:
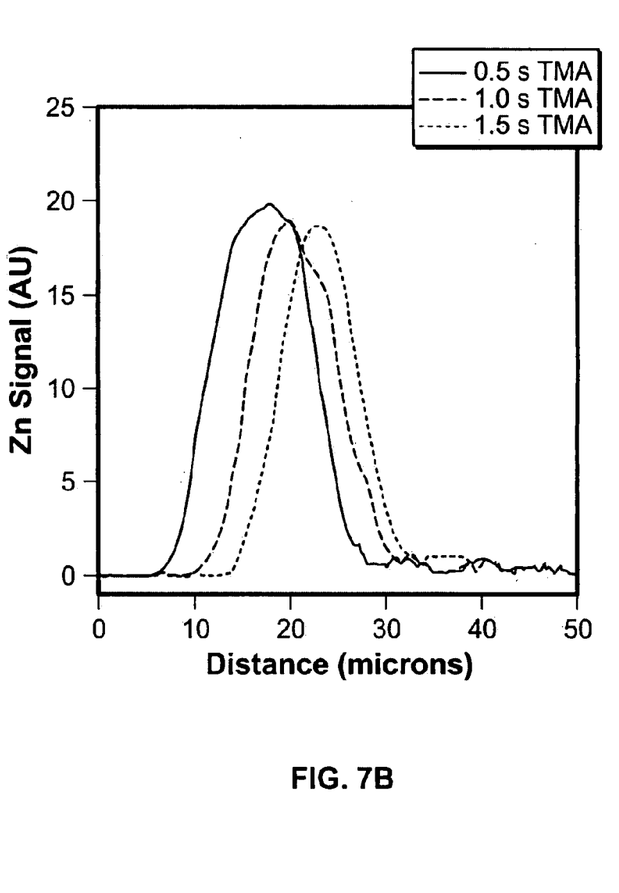
FIG. 7B shows a plot of Monte Carlo simulations conducted using the parameters of the process of FIGS. 6A, 6B, and 6C indicating the position of the Zn stripe with respect to the edge of the AAO membrane.

FIG. 7A shows a linescan generated by averaging the EDAX image data presented in FIGS. 6A, 6B, and 6C. The solid, dashed, and dotted lines illustrate the position and depth of the ZnO stripes achieved after TMA exposure of 0.5, 1.0, and 1.5 seconds, respectively. Table 1 summarizes the approximate starting and ending depths of the ZnO stripes from the exposed surface of the membrane and the approximate widths of the ZnO stripes. FIG. 7B shows the results of the Monte Carlo simulations conducted for the ZnO internal striping trials of the same timing sequences employed in the physical experiments. The simulations correspondingly indicate that the ZnO stripes narrow with increasing TMA exposure time.

The ZnO stripe narrowing effect results from the masked region extending farther into the nanopores and, consequently, decreasing the fraction of the DEZ molecules in each cycle encountering an empty site in the tube before exiting. Because fewer DEZ molecules react with the pore wall, the ZnO stripe becomes more narrow with increased exposure of the AAO membrane 10 to the masking precursor.

TABLE 1

Summary of Formation of Internal ZnO Stripes

| TMA Exposure (s) | Starting Depth (microns) | Ending Depth (microns) | Width (microns) |
|---|---|---|---|
| 0.5 | 11 | 22 | 11 |
| 1.0 | 16 | 25 | 9 |
| 1.5 | 20 | 28 | 8 |

EXAMPLE 5

Formation of $TiO_2$ Internal Stripes in AAO

Figure 8A:
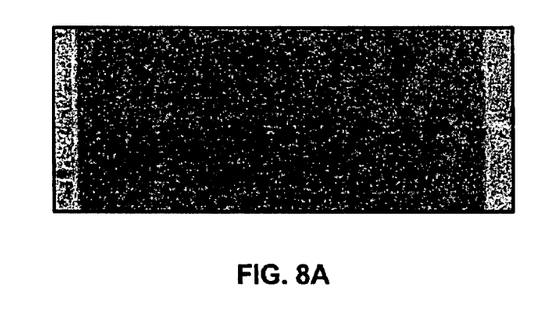
FIG. 8A shows an SEM secondary electron image of an AAO membrane coated with a $TiO_2$ stripe.
Figure 8B:
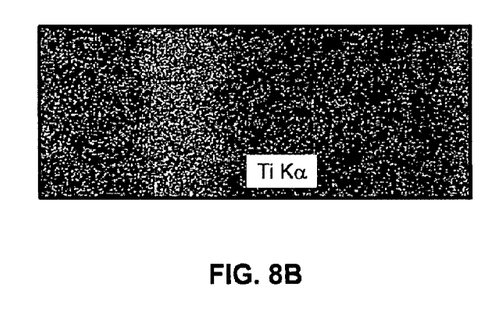
FIG. 8B shows an EDAX elemental map for Ti of the image of FIG. 5A indicating the position of the $TiO_2$ stripe within the nanopores.
Figure 8C:
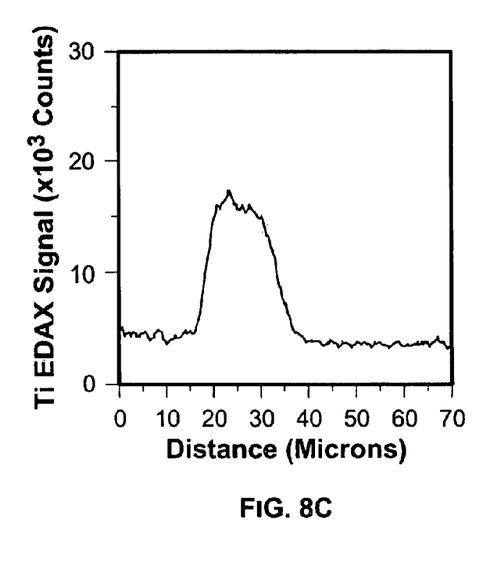
FIG. 8C show a linescan of the data of FIG. 8B showing the position of the $TiO_2$ stripe with respect to the edge of the AAO membrane.

An internal stripe of $TiO_2$ was formed in the AAO membrane 10 by applying 60 cycles of TMA/$TiCl_4$/$H_2O$ with the timing sequence of 1-10-3-10-4-10 at a temperature of 100° C. The EDAX Ti map of the resulting sample illustrated in FIG. 8B shows that the result of this treatment is to create an internal stripe of TiO$_2$ that begins about 18 μm from the front side of the AAO membrane 10. The front side of the AAO membrane 10 is clearly visible on the left side of the SEM image depicted in FIG. 8A as the interface between the white Ag epoxy and the darker AAO material. The line scan in FIG. 8C shows that the TiO$_2$ internal stripe has a width of about 15 μm. As with the ZnO ALD, the TMA is an effective masking agent for the subsequent TiCl$_4$ exposures, and the masking effect allows the position of the TiO$_2$ stripe to be controlled in the AAO nanopores by adjusting the ALD timing sequence.

EXAMPLE 6

Formation of Two MgO Internal Stripes in AAO

Figure 9A:
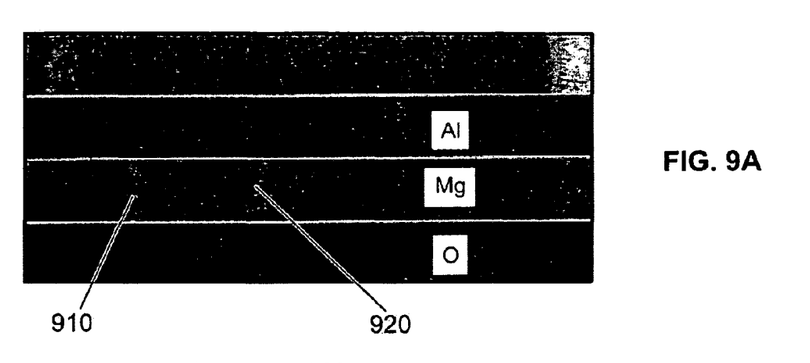
FIG. 9A shows an EDAX elemental map for Al, Mg, and O of an AAO membrane nanopore coated with a first MgO stripe and a second MgO stripe.
Figure 9B:
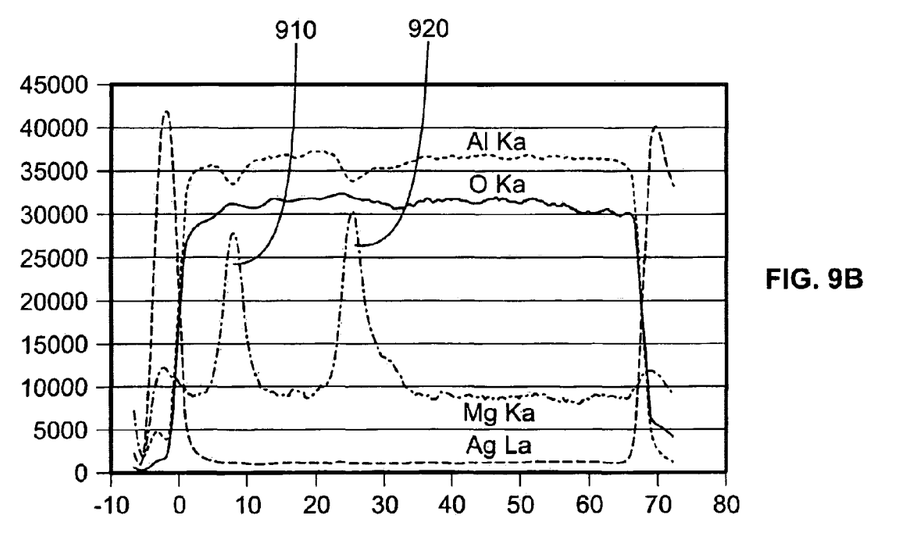
FIG. 9B shows a linescan of the data of FIG. 9B showing the positions of the first MgO stripe and the second MgO stripe with respect to the edge of the AAO membrane.

Two internal stripes of MgO were formed in the AAO membrane 10 through deposition of Bis(cyclopentadienyl) magnesium ("MgCp$_2$"). TMA was used as a masking agent to prevent the adsorption of MgCp$_2$ into AAO membrane 10 at the pore entrance region. By applying 25 cycles of TMA/MgCp$_2$/TMA/MgCp$_2$/H$_2$O using the timing sequence 0.25-5-1-5-1.5-5-5-5-6-10, two distinct internal stripes within the nanopores 20 of the AAO membrane 10 were formed. FIG. 9A is an EDAX Mg map of the resulting sample, showing a first internal Mg stripe 910 and a second internal Mg stripe 920. The line scan of FIG. 9B likewise illustrates the positions of the first internal Mg strip 910 and the second internal Mg stripe 920. The positions of the internal Mg stripes can be controlled in the AAO nanopores by adjusting the ALD timing sequence.

EXAMPLE 7

Formation of an Internal Stripe of ZnO in Silica Gel Powder

Figure 10A:
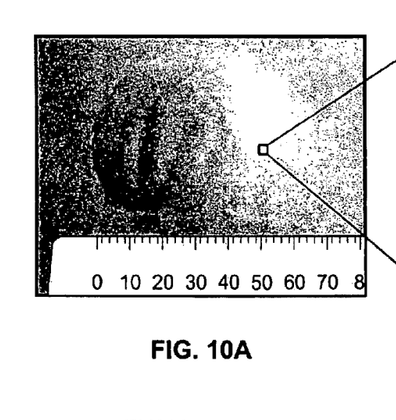
FIG. 10A shows an image of bulk silica gel powder.
Figure 10B:
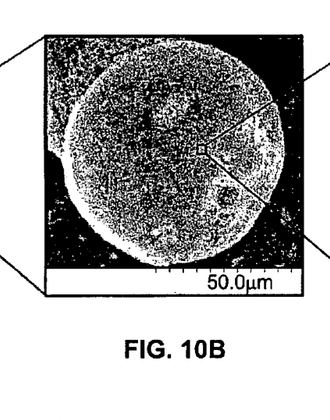
FIG. 10B shows an SEM image of a representative particle of the silica gel powder of FIG. 10A.
Figure 10C:
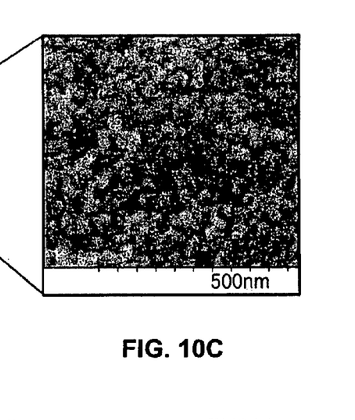
FIG. 10C shows an SEM image of a representative portion of the silica gel particle of FIG. 10B indicating the porous structure of the particle.
Figure 11A:
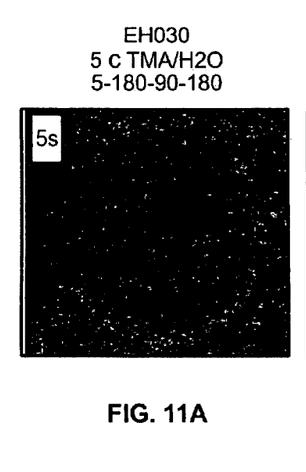
FIG. 11A shows an EDAX elemental map for Al of the silica gel particle of FIG. 10B following 5 second exposures of TMA for ALD of $Al_2O_3$.
Figure 11B:
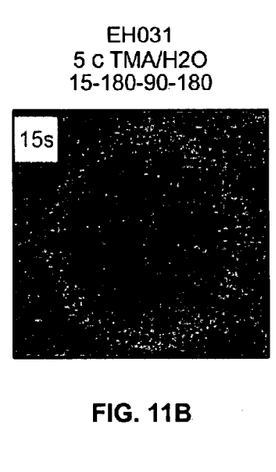
FIG. 11B shows an EDAX elemental map for Al of the silica gel particle of FIG. 10B following 15 second exposures of TMA for ALD of $Al_2O_3$.
Figure 11C:
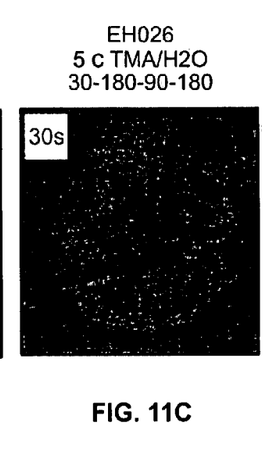
FIG. 11C shows an EDAX elemental map for Al of the silica gel particle of FIG. 10B following 30 second exposures of TMA for ALD of $Al_2O_3$.
Figure 11D:
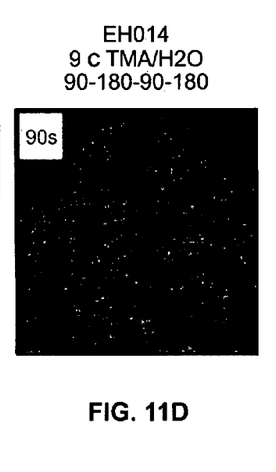
FIG. 11D shows an EDAX elemental map for Al of the silica gel particle of FIG. 10B following 90 second exposures of TMA for ALD of $Al_2O_3$.

Surface stripes of Al$_3$O$_3$ were formed in a silica gel powder to various depths using TMA to establish the relationship between time and depth of penetration of TMA which will serve as the mask stripe in subsequent trials. A series of trials were conducted varying the duration of TMA exposure, while maintaining other parameters constant. TMA exposure times of 5, 15, 30, and 90 seconds were applied to a silica gel powder. As illustrated in FIGS. 10A, 10B, and 10C, the powder comprised of 100 micron particles having 30 nm pores in a powder bed fixture. The results achieved by these processes are illustrated in the EDAX elemental maps for Al depicted in FIGS. 11A, 11B, 11C, and 11D. As demonstrated by these figures, the penetration of the ALD coatings for an object with spherical geometry proceeds in a similar predictable manner as was previously illustrated for the one dimensional AAO substrates.

Figure 12A:
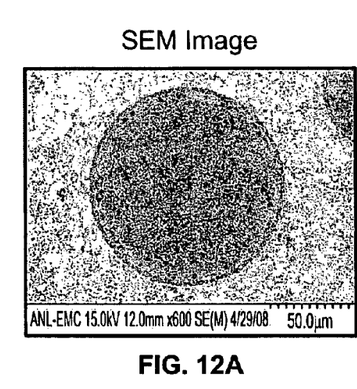
FIG. 12A shows an SEM secondary electron image of the cross section of a spherical silica gel particle following deposition of a ZnO internal stripe using 2 second exposures to TMA followed by 10 second exposures to DEZ.
Figure 12B:
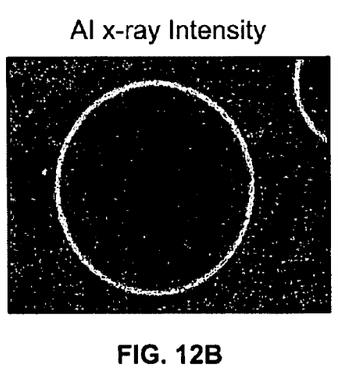
FIG. 12B shows an EDAX elemental map for Al of the spherical silica gel particle in FIG. 12A.
Figure 12C:
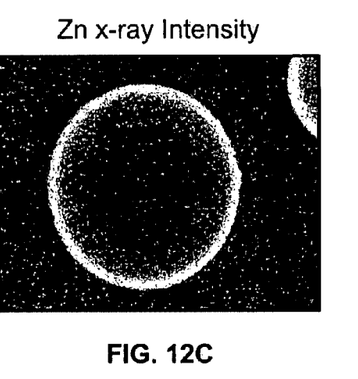
Figure 12D:
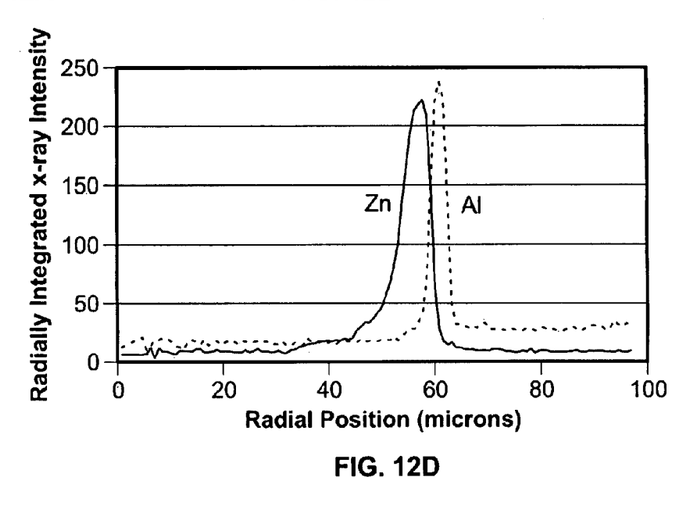
FIG. 12D is a linescan of the data in FIG. 12B and FIG. 12C showing the positions of the Al and Zn along the radial axis of the spherical silica gel particle.

An internal stripe of ZnO was formed in the same silica gel powder using TMA as a masking agent to prevent absorption of the DEZ. A TMA mask exposure time of 2 seconds followed by a 10 sec exposure of DEZ was applied to the silica gel powder. As illustrated in FIGS. 12A, 12B, and 12C, an internal stripe of ZnO has been deposited in the silica gel powder starting from a depth of approximately 3 microns defined by the trailing edge of the Al$_2$O$_3$ mask stripe and proceeding radially inward to a depth of 9 microns. The corresponding radial elemental distribution profile of the Al$_2$O$_3$ mask and ZnO internal stripe is illustrated in FIG. 12D.

Figure 13A:
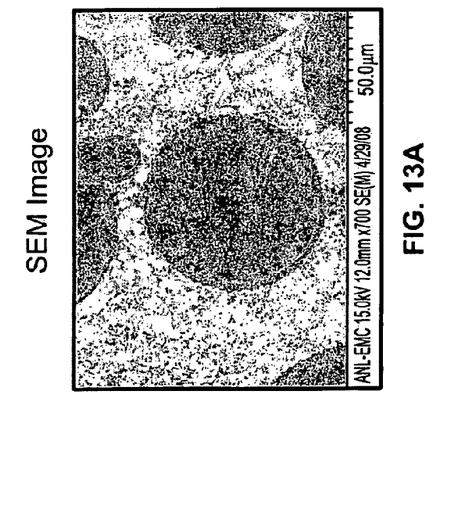
FIG. 13A shows an SEM secondary electron image of the cross section of a defective silica gel particle containing two large fissures following deposition of a ZnO internal stripe using 2 second exposures to TMA followed by 10 second exposures to DEZ.
Figure 13B:
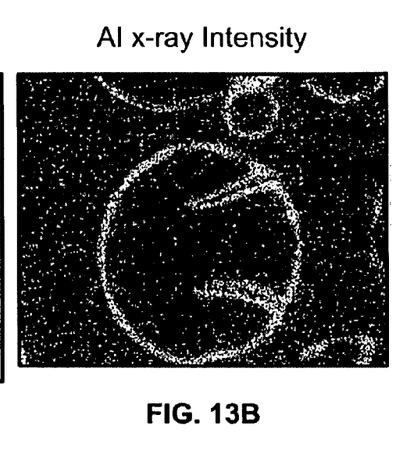
FIG. 13B shows an EDAX elemental map for Al of the defective silica gel particle in FIG. 13A.
Figure 13C:
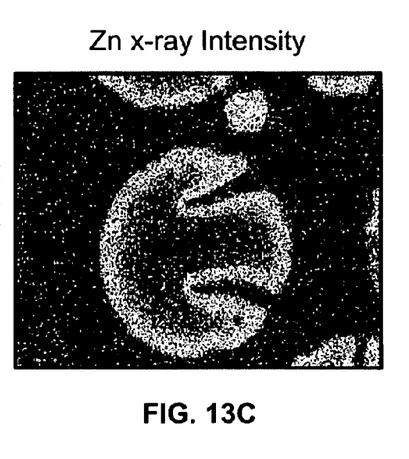
FIG. 13C shows an EDAX elemental map for Zn of the defective silica gel particle in FIG. 13A.

As a further illustration of the generality of the method, FIGS. 13A, 13B, 13C, illustrate another porous particle from the same trial as shown above in FIG. 12. This particular particle is defective and contains fissures that are accessible from the particle surface. The resultant internal ZnO stripe appears to follow conformally to the exterior surface of the particle, of which the fissure are a part. This illustrates the ability of the method to coat generally complex three-dimensional porous objects. The condition for this to be true is that the rate of diffusion of the ALD chemicals into the porous object being coated must be substantially less than diffusion of the same chemical in the surroundings of the particle including the fissures during the deposition.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method for preparing a substrate, comprising:
   providing an atomic layer deposition (ALD) system;
   providing a substrate, the substrate having at least one external surface, wherein the at least one external surface can be at least one of planar and a complex topography including folds, and including a plurality of nanopores each having a pore surface and the nanopores extending from the at least one external surface comprising the at least one of planar and the complex topography, where the pores can be oriented at any angle with respect to the local surface normal, and can be at least one of straight or tortuous such that the pore surface can be oriented at any angle with respect to the local surface normal, thereby having no line-of-sight access relative to the local surface normal, and where the nanopores have an aspect ratio, A=L/d greater than 89 where L is the pore length and d is the pore diameter;
   providing a first gaseous precursor reactive with at least a portion of the substrate;
   providing a second gaseous precursor reactive with at least a portion of the substrate, and substantially not reactive with the first precursor;
   exposing the substrate to the first precursor within the ALD system for a first predetermined period, the first precursor reacting with a first surface portion of one or more of the plurality of nanopores and reacting regardless of the angle of the nanopores with the local surface normal and thereby depositing a mask on the first surface portion;
   exposing the substrate to the second precursor within the ALD system for a second predetermined period, the second precursor reacting with a second surface portion of one or more of the plurality of nanopores and reacting regardless of the angle of the pore with the local surface normal and further all the second precursor remaining with the substrate; and
   wherein the mask substantially prevents reaction of the second precursor with the first surface portion, thereby providing a desired chemical functionality for the first and second surface portions of the nanopores.

2. The method of claim 1, wherein the second surface portion is disposed a distance from the at least one external surface, and wherein the distance is substantially normal to the at least one external surface.

3. The method of claim 2, wherein a stripe having a width is deposited on the second surface portion as a result of the reaction of the second precursor and the substrate.

4. The method of claim 3, wherein the stripe comprises at least one of a metal, metal oxide, metal nitride, metal sulfide, metal phosphide and metal carbide.

5. The method of claim 2, further comprising selecting the first predetermined period to obtain a desired distance.

6. The method of claim 3, further comprising selecting the second predetermined period to obtain a desired width.

7. The method of claim 1, wherein the first precursor comprises trimethyl aluminum.

8. The method of claim 1, wherein the second precursor comprises a metal selected from the group consisting of: Al, Mg, Nb, Ti, V and Zn.

9. The method of claim 1, wherein the substrate comprises a particle.

10. The method of claim 1, further comprising:
providing a third precursor; and
exposing the substrate to the third precursor within the ALD system for a third predetermined period,
wherein the third precursor is selected to react with at least one of the stripe and the mask.

11. The method of claim 1, further comprising providing a third precursor configured to coat at least a third surface portion of one or more of the plurality of nanopores, the third precursor substantially nonreactive toward the first precursor and the second precursor deposited within the nanopore.

12. The method of claim 1, further comprising providing a coreactant configured to react with at least one of the masking compound, the first precursor and the second precursor deposited within the nanopore.

13. The method of claim 1, further comprising selecting a first exposure duration, wherein the substrate is exposed to the first precursor for the first duration, and wherein the second surface portion is coated a distance which is a function of the first exposure duration.

14. The method of claim 1, further comprising selecting a second exposure duration, wherein the substrate is exposed to the second precursor for the second duration, and wherein the third surface portion is coated a distance which is a function of the second exposure duration.

* * * * *